United States Patent [19]

Chan et al.

[11] Patent Number: 4,596,002
[45] Date of Patent: Jun. 17, 1986

[54] RANDOM ACCESS MEMORY RAM EMPLOYING COMPLEMENTARY TRANSISTOR SWITCH (CTS) MEMORY CELLS

[75] Inventors: Yuen H. Chan, Wappingers Falls; Frank D. Jones, Wallkill; William F. Stinson, LaGrangeville, all of N.Y.

[73] Assignee: International Business Machines Corporation, Armonk, N.Y.

[21] Appl. No.: 624,488

[22] Filed: Jun. 25, 1984

[51] Int. Cl.⁴ .............................................. G11C 13/00
[52] U.S. Cl. ...................................... 365/189; 365/203
[58] Field of Search ............... 365/174, 175, 182, 189, 365/202, 230, 203

[56] References Cited

U.S. PATENT DOCUMENTS

| | | | |
|---|---|---|---|
| 3,423,737 | 1/1969 | Harper | 340/173 |
| 3,525,084 | 8/1970 | Dunlop | 340/174 |
| 3,582,911 | 6/1971 | Smith | 340/174 |
| 3,623,033 | 11/1971 | Harding | 340/174 |
| 3,636,377 | 1/1972 | Economopoulos | 307/238 |
| 3,736,574 | 5/1973 | Gerbach | 340/173 |
| 3,753,008 | 8/1973 | Gaurnaschelli | 307/270 |
| 3,771,147 | 11/1973 | Boll | 340/173 |
| 3,786,442 | 1/1974 | Alexander | 340/173 |
| 3,789,243 | 1/1974 | Donofrio | 307/238 |
| 3,843,954 | 10/1974 | Hansen | 340/173 |
| 3,863,291 | 1/1975 | Gerbach | 340/173 |
| 3,919,566 | 11/1975 | Millhollan | 307/235 |
| 3,942,160 | 3/1976 | Yu | 340/173 |
| 4,007,451 | 2/1977 | Heuber | 340/173 |
| 4,042,915 | 8/1977 | Reed | 340/173 |
| 4,078,261 | 3/1978 | Millhollan | 365/189 |
| 4,090,254 | 5/1978 | Ho | 365/150 |
| 4,104,735 | 8/1978 | Hofmann | 365/230 |
| 4,174,541 | 11/1979 | Schmitz | 365/227 |
| 4,194,130 | 3/1980 | Moench | 307/205 |
| 4,242,605 | 12/1980 | Seelbach | 307/270 |
| 4,264,828 | 4/1981 | Perlegos | 307/463 |
| 4,287,575 | 9/1981 | Eardley | 365/174 |
| 4,308,595 | 12/1981 | Houghton | 365/203 |
| 4,323,986 | 4/1982 | Malaviva | 365/174 |
| 4,326,270 | 4/1982 | Owens | 365/218 |
| 4,330,853 | 5/1982 | Heimeier | 365/227 |

OTHER PUBLICATIONS

"Static Cell Array Circuit to Enable Write by Turning Off the Cell Load Devices", by D. B. Eardley, IBM Technical Disclosure Bulletin, vol. 24, No. 6, Nov. 1981, p. 3044.

"AC Write Scheme for Bipolar Random-Access Memories Using Schottky Coupled Cells", by J. A. Dorler, J. M. Mosley, R. O. Seeger, J. R. Struk, IBM Technical Disclosure Bulletin, vol. 23, No. 11, Apr. 1981, p. 4960.

"Constant Voltage, Current Sensing Circuit" by V. Marcello, A. P. Mercer, C. G. Rivadeneira and J. R. Struk, IBM Technical Disclosure Bulletin, vol. 24, No. 1B, Jun. 1981, p. 483.

"Tri-State Read/Write Circuit" by V. Marcello, C. G. Rivadeneira and J. R. Struk, IBM Technical Disclosure Bulletin, vol. 24, No. 1B, Jun. 1981, p. 480.

"Read/Write Control Circuit Reference Voltage Generator" by V. Marcello, C. G. Rivadeneira and J. R. Struk, IBM Technical Disclosure Bulletin, vol. 24, No. 1B, Jun. 1981, p. 478.

"Bit Current Steering Network" by V. Marvello, C. G. Rivadeneira and J. R. Struk, IBM Technical Disclosure Bulletin, vol. 24, No. 1B, Jun. 1981, p. 475.

"Complementary Transistor Switch Memory Cell" by J. A. Dorler, R. M. Esposito and S. Ogwaw, IBM Technical Disclosure Bulletin, vol. 16, No. 12, May 1974 p. 3931.

"Memory Cell" by S. K. Wiedmann, IBM Technical Disclosure Bulletin, vol. 13, No. 3, Aug. 1970, p. 616.

"A 1024-Byte ECL Random Access Memory Using a Complementary Transistor Switch (CTS) Cell" by J. A. Dorler, J. M. Mosley, G. A. Ritter, R. O. Seeger and J. R. Struk IBM Journal of Research and Development vol. 25, No. 2 and 3, May 1981.

Primary Examiner—Terrell W. Fears
Attorney, Agent, or Firm—Wesley DeBruin

[57] ABSTRACT

The disclosure is directed to an improved random access memory (RAM). More particularly to improved bit selection circuitry for use in an array employing CTS (Complementary Transistor Switch) type memory cells.

14 Claims, 16 Drawing Figures

ADDRESS RECEIVER

BIT DECODER CIRCUIT

BIT-UP-LEVEL CLAMP CIRCUIT

WORD DECODER

SENSE AMPLIFIER CIRCUIT

SENSE AMPLIFIER ARRANGEMENT

VOLTAGE MODE READ OPERATION

VOLTAGE MODE WRITE OPERATION

WRITE OPERATION WAVEFORMS

RANDOM ACCESS MEMORY RAM EMPLOYING COMPLEMENTARY TRANSISTOR SWITCH (CTS) MEMORY CELLS

CROSS REFERENCE TO RELATED U.S. PATENT APPLICATION

U.S. patent application Ser. No. 624,486 entitled "Voltage Mode Operation Scheme For Bipolar Array" filed June 25, 1984 by Y. H. Chan and J. R. Struk.

U.S. patent application Ser. No. 624,489 entitled "Improved Random Access Memory Array" filed June 25, 1984 by Y. H. Chan.

BACKGROUND OF THE INVENTION

1. Field of the Invention

The invention is directed to an improved random access memory (RAM). More particularly the invention is directed to improved bit selection circuitry and to improved word line selection circuitry for an array using CTS (Complementary Transistor Switch) memory cells.

2. Background Art

The following patents and publications are directed to memory array circuitry and more particularly bit selection, word line selection and related circuitry employed therein. It is to be appreciated that the following art is not submitted to be the only, the best, or the most pertinent art.

Patents

U.S. Pat. No. 3,423,737 entitled "Nondestructive Read Transistor Memory Cell" granted Jan. 21, 1969 to L. R. Harper.

U.S. Pat. No. 3,525,084 entitled "Memory Sense System with Fast Recovery" granted Aug. 18, 1970 to L. J. Dunlop et al.

U.S. Pat. No. 3,582,911 entitled "Core Memory Selection Matrix" granted June 1, 1971 to J. P. Smith.

U.S. Pat. No. 3,623,033 entitled "Cross-Coupled Bridge Core Memory Addressing System" granted Nov. 23, 1971 to P. A. Harding.

U.S. Pat. No. 3,636,377 entitled "Bipolar Semiconductor Random Access Memory" granted Jan. 18, 1972 to P. C. Economopoulos et al.

U.S. Pat. No. 3,736,574 entitled "Pseudo-Hierarchy Memory System" granted Dec. 30, 1971 to E. D. Gersbach et al.

U.S. Pat. No. 3,753,008 entitled "Memory Pre-Driver Circuit" granted Aug. 14, 1973 to G. Guarnashelli.

U.S. Pat. No. 3,771,147 entitled "IGFET Memory System" granted Nov. 6, 1973 to H. J. Boll et al.

U.S. Pat. No. 3,786,442 entitled "Rapid Recovery Circuit For Capacitively Loaded Bit Lines" granted Jan. 15, 1974 to S. B. Alexander et al.

U.S. Pat. No. 3,789,243 entitled "Monolithic Memory Sense Amplifier/Bit Driver Having Active Bit/Sense Pull-Up" granted Jan. 29, 1974 to N. M. Donofrio et al.

U.S. Pat. No. 3,843,954 entitled "High-Voltage Integrated Driver Circuit and Memory Embodying Same" granted Oct. 22, 1974 to A. A. Hansen et al.

U.S. Pat. No. 3,863,229 entitled "SCR (or SCS) Memory Array With Internal and External Load Resistors" granted Jan. 28, 1975 to J. E. Gersbach.

U.S. Pat. No. 3,919,566 entitled "Sense-Write Circuit for Bipolar Integrated Circuit Ram" granted Nov. 11, 1975 to M. S. Millhollan et al.

U.S. Pat. No. 3,942,160 entitled "Bit Sense Line Speed-Up Circuit for Mos Ram" granted Mar. 2, 1976 to R. T. Yu.

U.S. Pat. No. 4,007,451 entitled "Method and Circuit Arrangement for Operating A Highly Integrated Monolithic Information Store" granted Feb. 8, 1977 to K. Heuber et al.

U.S. Pat. No. 4,042,915 entitled "Mos Dynamic Random Access Memory Having An Improved Address Decoder Circuit" granted Aug. 16, 1977 to J. A. Reed.

U.S. Pat. No. 4,078,261 entitled "Sense/Write Circuits for Bipolar Random Access Memory" granted Mar. 7, 1978 to M. S. Millhollan et al.

U.S. Pat. No. 4,090,254 entitled "Charge Injector Transistor Memory" granted May 16, 1978 to I. T. Ho et al.

U.S. Pat. No. 4,104,735 entitled "Arrangement for Addressing A Mos Store" granted Aug. 1, 1978 to R. Hofmann.

U.S. Pat. No. 4,174,541 entitled "Bipolar Monolithic Integrated Circuit Memory With Standby Power Enable" granted Nov. 13, 1979 to C. R. Schmitz.

U.S. Pat. No. 4,194,130 entitled "Digital Predecoding System" granted Mar. 18, 1980 to J. D. Moench.

U.S. Pat. No. 4,242,605 entitled "Transient Array Drive For Bipolar Rom/Prom" granted Dec. 30, 1980 to W. C. Seelbach.

U.S. Pat. No. 4,264,828 entitled "Mos Static Decoding Circuit" granted Apr. 28, 1981 to G. Peregos et al.

U.S. Pat. No. 4,287,575 entitled "High Speed High Density, Multi-Port Random Access Memory Cell" granted Sept. 1, 1981 to D. H. Eardley et al.

U.S. Pat. No. 4,308,595 entitled "Array Driver" granted Dec. 29, 1981 to R. J. Houghton.

U.S. Pat. No. 4,323,986 entitled "Electric Storage Array Having DC Stable Conductivity Modulated Storage Cells" granted Apr. 6, 1982 to S. D. Malaviva.

U.S. Pat. No. 4,326,270 entitled "Preset Circuit For Information Storage Devices" granted Apr. 20, 1982 to W. K. Owens et al.

U.S. Pat. No. 4,330,853 entitled "Method of and Circuit Arrangement For Reading and/or Writing An Integrated Semiconductor Storage With Storage Cells In MLT (I²L) Technology" granted May 18, 1982 to H. H. Heimeier, et al.

Publications

[IBM Technical Disclosure Bulletin (IBM TDB)]

"Static Cell Array Circuit to Enable Write by Turning Off The Cell Load Devices" by D. B. Eardley, IBM TDB, Vol. 24, No. 6, November 1981, pages 3044–47.

"AC Write Scheme For Bipolar Random-Access Memories Using Schottky Coupled Cells" by J. A. Dorler et al, IBM TDB, Vol. 23, No. 11, April 1981, pages 4960-2.

"Constant Voltage, Current Sensing Circuit" by V. Marcello et al, IBM TDB, Vol. 24, No. 1B, June, 1981, pages 483-4.

"Tri-State Read/Write Control Circuit" by V. Marcello et al, IBM TDB Vol 24, No. 1B, June 1981, pages 480-2.

"Read/Write Control Circuit Reference Voltage Generator" by V. Marcello et al, IBM-TDB, Vol. 24, No. 1B, June, 1981, pages 478-9.

"Bit Current Steering Network" by V. Marcello et al, IBM TDB Vol 24, No. 1B, June 1981, pages 475-77.

"Complementary Transistor Switch Memory Cell" by J. A. Dorler et al, IBM TDB, Vol 16, No. 12, May 1984.

"Memory Cell" by S. K. Wiedmann, IBM TDB Vol 13, No. 3, August 1970, pages 616-7.

"A 1024 Byte ECL Random Access Memory Using a Complementary Transistor Switch (CTS) Cell" by J. A. Dorler et al, IBM Journal of Research and Development, Vol. 25, No. 3, May, 1981, pages 126-34.

Random access memories employing CTS type memory cells are known to the art. See for the example, the Gerbach U.S. Pat. No. 3,863,229, the Dorler et al IBM TDB publication, and the Dorler et al IBM Journal of Research and Development Article, each fully identified hereinabove.

The known random access memories and the in particular those employing CTS memory cells have two relatively serious bit selection short comings. First, the bit decode transistor has to drive a number of bit columns across the chip. Due to long metal line and large fan out current, voltage drop along the bit decode line is high. The cells at the end of the bit decode line may have insufficient voltage across their "1" bit rail resistors to provide adequate gate currents into the cells. This may lead to potential data retention problems on the selected cells. Secondly, both selection and deselection of the bit rails are slow due to the fact that the bit decode transistor has large fan-out loadings. Discharge speed of the bit rails is limited by the bit rail resistors. The bit selection scheme in accordance with the invention obviates the above recited shortcomings of known RAMs and in particular RAMs using CTS cells.

In high performance arrays using cells like CTS, selection of a cell is accomplished by lowering its word lines and raising its bit rails. Known designs use a fixed current source to pull down the selected word lines. There are three problems usually associated with this method of word selection in "current mode".

(1) Slow speed.

With CTS cells, the word lines are very capacative. (For word lines having 60 to 80 cells, this word line capacitance could be as high as 30 to 40 pf). A constant current source pulls down the selected word lines according to its large RC time constant. Hence cell selection is very slow, and its drive capability is often limited by the fixed source of current.

(2) Instability.

Since the selected word lines are held down by a current source, their voltage levels are easily affected by noise or current source variations. If the word line levels drift to a degree that they no longer track with those of the bit rails, data retention problems could result.

(3) Long address set up time to "write".

During write operation, the bit line voltage of the side to be written a "1" is driven high. This causes the bit rail and the drain line levels to rise. A long address set up time is needed to wait for the previous selected cell to get out of the way before writing can start in order to avoid write-through problems.

The above problems are obviated and overcome by the "voltage mode word selection scheme" in accordance with the invention.

SUMMARY OF THE INVENTION

A primary object of the invention is to provide an improved random access memory.

A further object of the invention is to provide an improved random access memory which employs complementary transistor switch (CTS) memory cells.

A further object of the invention is to provide an improved bit selection scheme for a random access memory.

A further object of the invention is to provide an improved voltage mode word selection scheme for a random access memory.

A further object of the invention is to provide an improved bit selection scheme for a random access memory which employs complementary transistor switch (CTS) memory cells.

A further object of the invention is to provide an improved voltage mode word selection scheme for a random access memory which employs complementary transistor switch (CTS) memory cells.

A yet further object of the invention is to provide a random access memory employing bit selection circuitry which, particularly in a RAM employing CTS cells, obviates data retention concerns on fully selected cells.

A still further object of the invention is to provide a random access memory employing bit selection circuitry which, particularly in a RAM employing CTS cells, improves the line select and deselect speeds.

A still further object of the invention is to provide a random access memory employing a voltage mode word selection scheme which, particularly in RAM employing CTS cells, improves (1) speed of selection of word lines, (2) stability of selected word lines, and (3) reduces address set-up time for "write" operation.

The invention may be summarized as improved bit selection circuitry and word selection circuitry for a RAM, in particular one using CTS (Complementary Transistor Switch) cells. The bit select circuitry includes interconnected first and second level matrix decoders, each memory column has a pair of bit lines, each pair of bit lines has connected thereto bit select circuit means, each of said bit select circuit means being connected to an output of said second level decoder, a bit-up-level clamp circuit connected to each of said bit select circuit means of each pair of bit lines, each of said bit select circuit means including first circuit means for increasing the speed of selection of the selected pair of bit lines, said bit up-level clamp circuit cooperating with said bit select circuit means of said selected pair of bit lines for positively limiting the upper potential level of said selected pair of bit lines, and each of said bit select circuit means including second circuit means for increasing the speed of deselection of the selected pair of bit lines. The invention also includes voltage mode word selection means in a RAM preferably employing CTS type memory cells.

The foregoing and other objects, features and advantages of the invention will be apparent from the following more particular description of preferred embodiments of the invention, as illustrated in the accompanying drawings.

BRIEF DESCRIPTION OF THE DRAWING

FIG. 14 is to be viewed in conjunction with the explanation of the WRITE operation (FIG. 13) of the RAM (FIG. 3) in accordance with the invention.

DESCRIPTION OF THE PREFERRED EMBODIMENT

Figure 1:
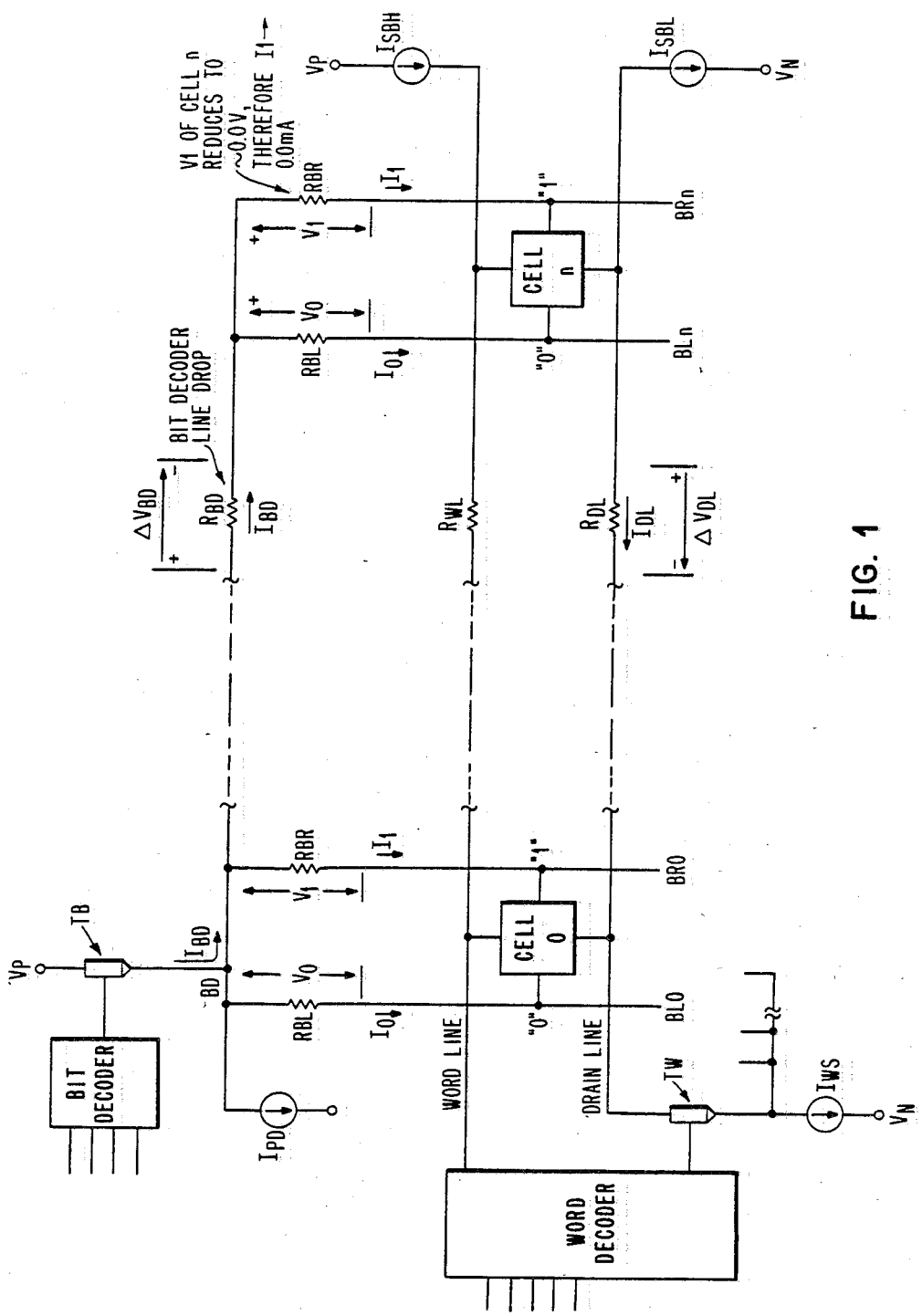
FIG. 1 illustrates bit select and word select circuitry in accordance with known RAMs employing CTS memory cells.

In high performance arrays using CTS cells, selection of a cell is done by lowering its word lines and raising its bit rails. As depicted in FIG. 1, known designs use a fixed current source to pull down the selected word and drain lines. There are three problems frequently associated with the "current mode" method of word selection.

(1) Slow speed.

With CTS cells, the word lines are very capacitive. (For word lines having 60 to 80 cells, this word line capacitance could be as high as 30 to 40 pf). A constant current source pulls down the selected word line according to its large RC time constant. Hence, cell selection is very slow, and its drive capability is often limited by the fixed source of current.

(2) Instability.

Since the selected word lines are held down by a current source, their voltage levels are easily affected by noise or current variations. If the word line levels drift to a degree that they no longer track with those of the bit rails, data retention problems could result.

(3) Long address set up time to "write".

During write operation, the bit line voltage of the side to be written a "1" is driven high. This causes the bit rail and the drain line levels to rise. A long address set up time is needed to wait for the previous selected cell to go out of the way before writing can start in order to avoid write-through problems.

Figure 8:
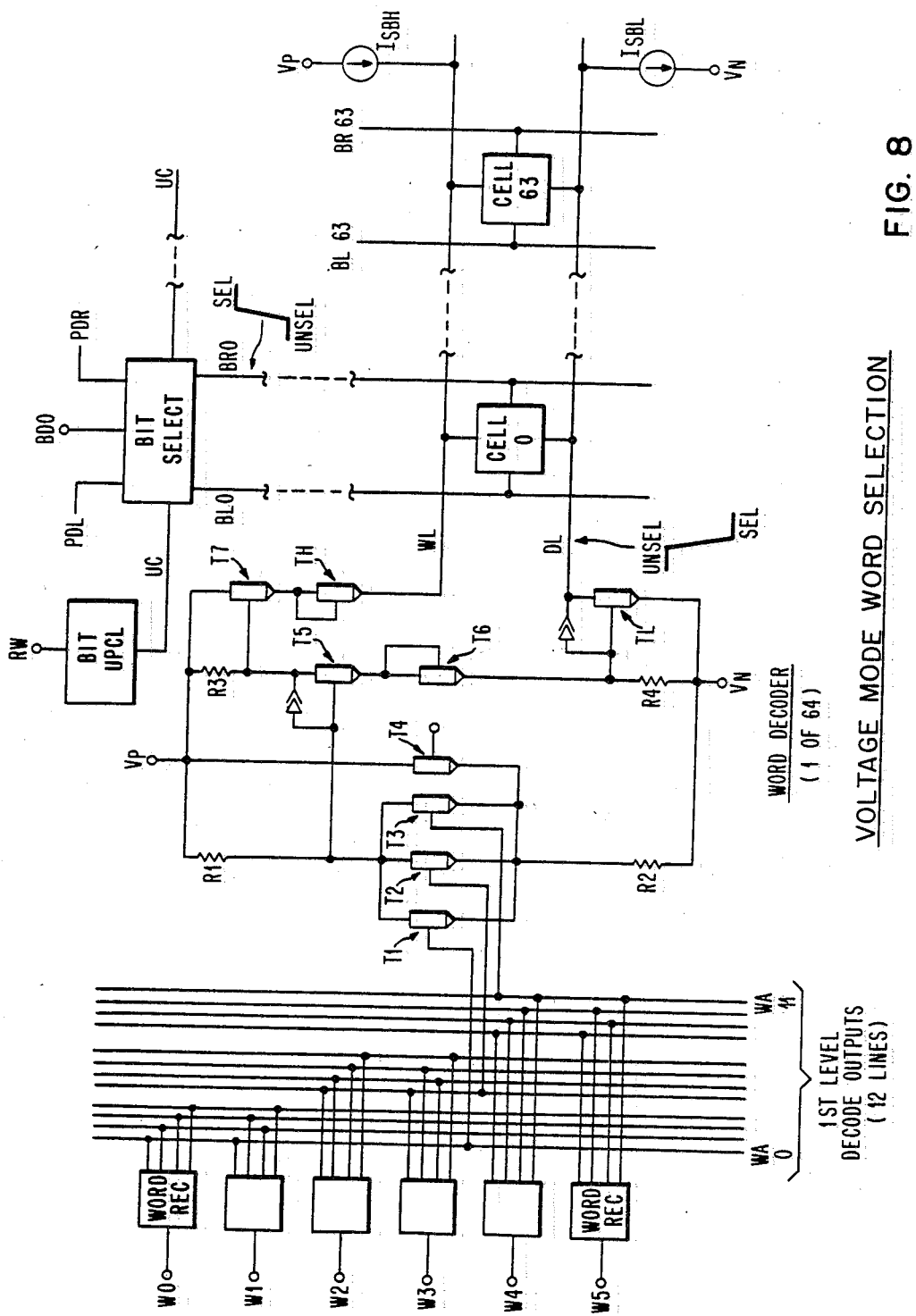
FIG. 8 illustrates the circuit diagram of "voltage mode" word selection scheme which may be employed in a RAM (FIG. 3) in accordance with the invention.

The above problems are overcome and obviated by the "voltage mode word selection technique" in accordance with the invention and as disclosed herein. FIG. 8 shows the schematic diagram of this scheme.

Also known high performance arrays using CTS cells have bit selection concerns or short comings. Again referring to FIG. 1, these concerns are as follows:

1. The bit decode transistor TB has to drive a number of bit columns across the chip. Due to long metal line and large fanout current, voltage drop along the bit decode line (BD) is high. The cells at the end of the bit decode line may have insufficient voltage potential across their "1" bit rail resistors to define adequate gate currents (I1) into the cells. This may lead to potential data retention problems on the selected cells.

2. Both selection and deselection of the bit rails are slow, due to the fact that the bit decode transistor has large fanout loadings. Discharge speed of the bit rails is limited by the bit rail resistors RBL and RBR.

The above problems and concerns are addressed and overcome by the random access memory disclosed hereinafter.

The above problems are overcome by using distributive bit select circuits and word line selection circuits illustrated FIGS. 3, 3A, 8 and 9.

Figure 2:
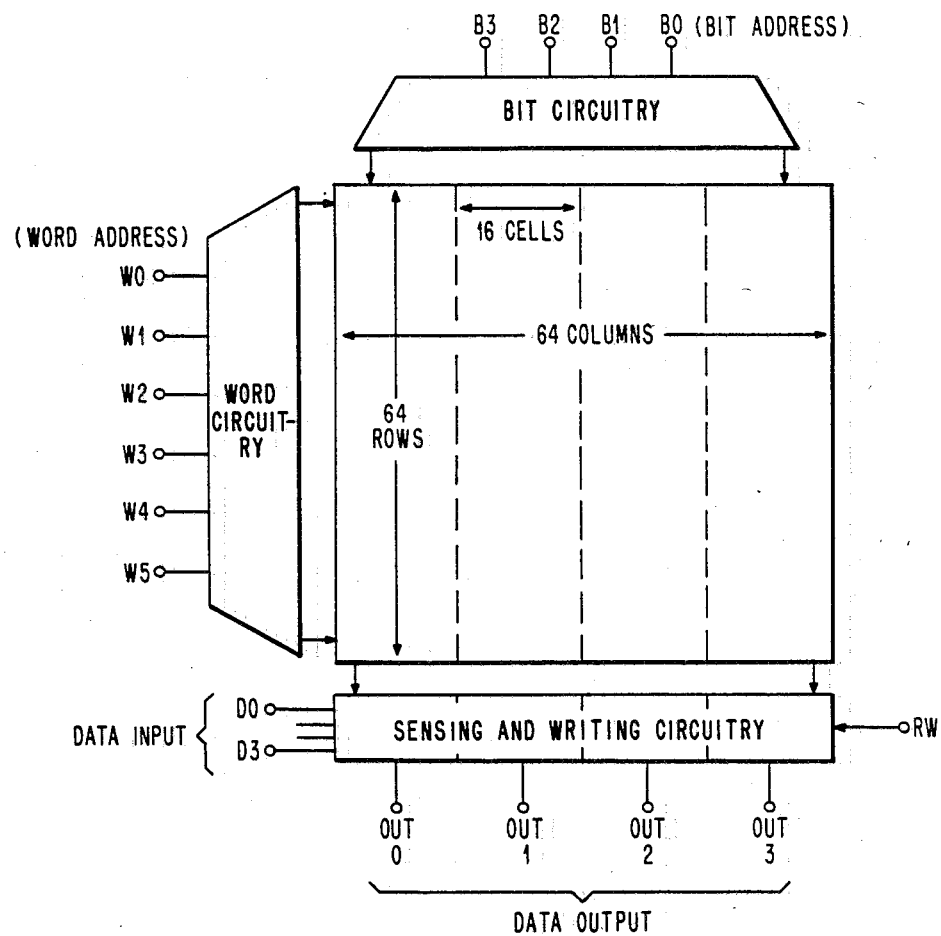
FIG. 2 illustrates a 1k×4 random access memory in accordance with the invention.

For purpose of illustration, FIG. 2 shows a 1k×4 RAM in accordance with the invention. This RAM has an array density of 4096 cells arranged in 64 words (rows) by 64 bit (columns). The 64 bit columns are further divided into 4 data groups, so that it will write 4 bits (therefore 4 data inputs) and read 4 bits (4 data outputs) at a time. The RAM has 6 word addresses (to select 1 out of 64 rows) and 4 bit addresses (to select 4 out of 64 bits). Read and write operations are controlled by the RW input.

Figure 3:
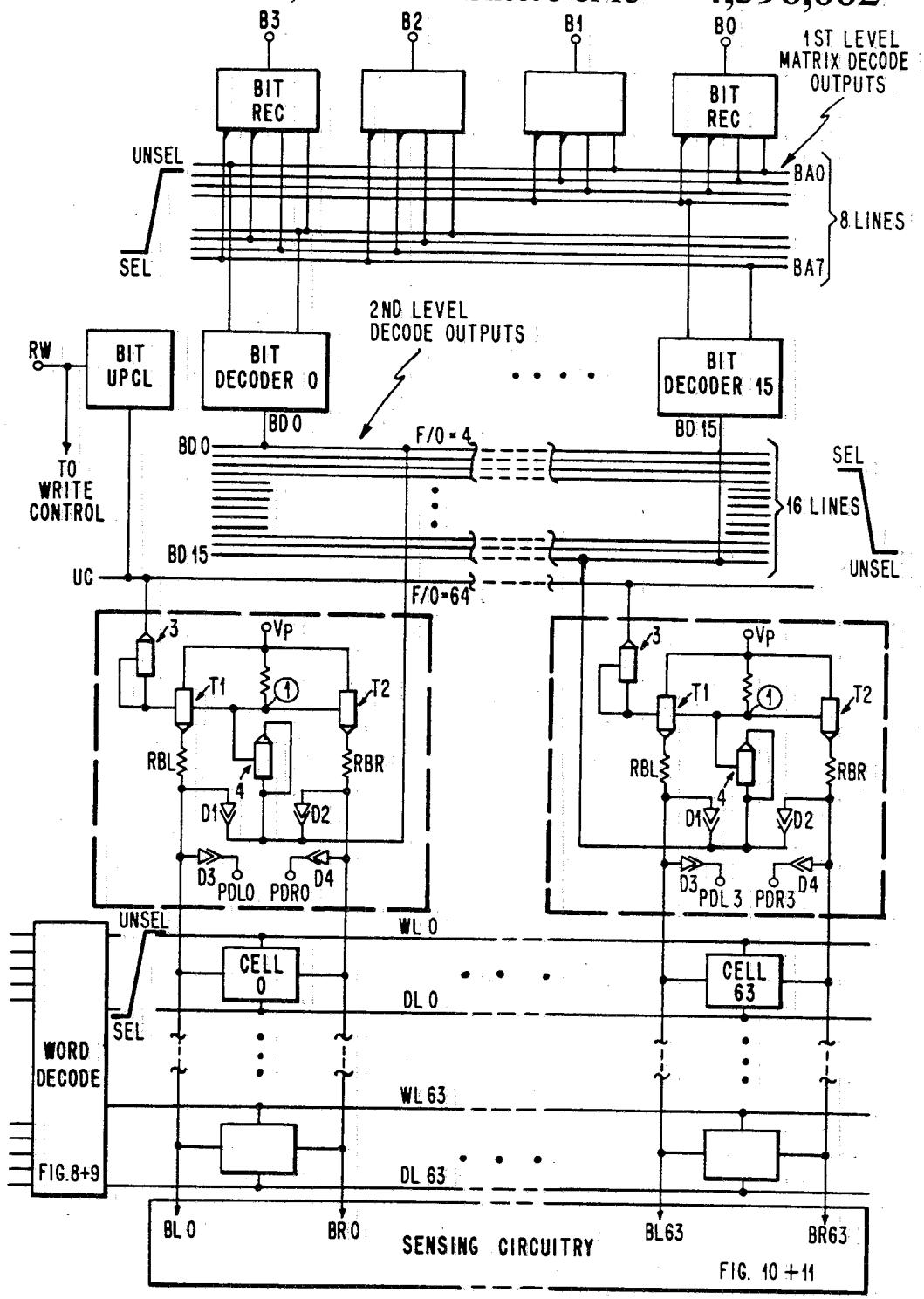
FIG. 3 illustrates the bit path circuitry of the random access memory shown in FIG. 2.
Figure 4:
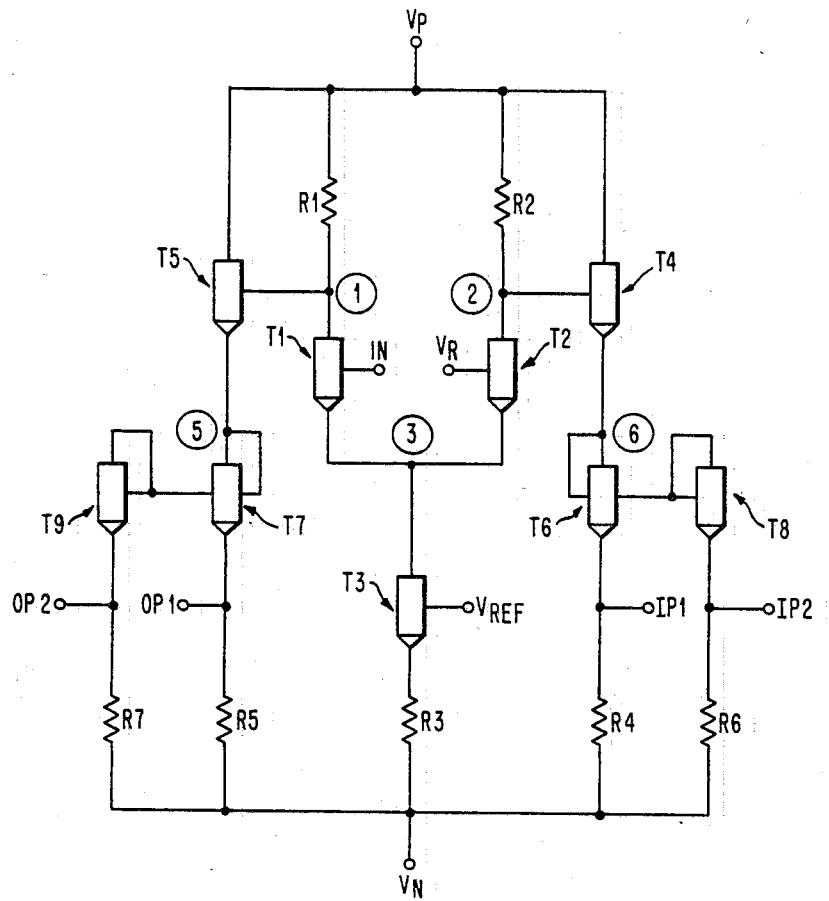
FIG. 4 is a circuit diagram of the address receiver circuits (Bit REC and Word REC) which may be employed in a RAM (FIG. 3) in accordance with the invention.

Referring to FIG. 3, a two level matrix decode scheme is employed for bit address decoding. The first level decode includes two groups of 4 address lines (BA0-BA3 and BA4-BA7) formed from output emitter dotting of the four bit address receivers. The bit address receivers are current switch emitter follower circuits as shown in FIG. 4. They convert the address inputs to true and complement signals. By means of emitter follower output dotting of the address receiver pairs, a partial decode of 1 out of 4 is formed from each group, hence, giving a total of two selected (low level) lines.

Figure 5:
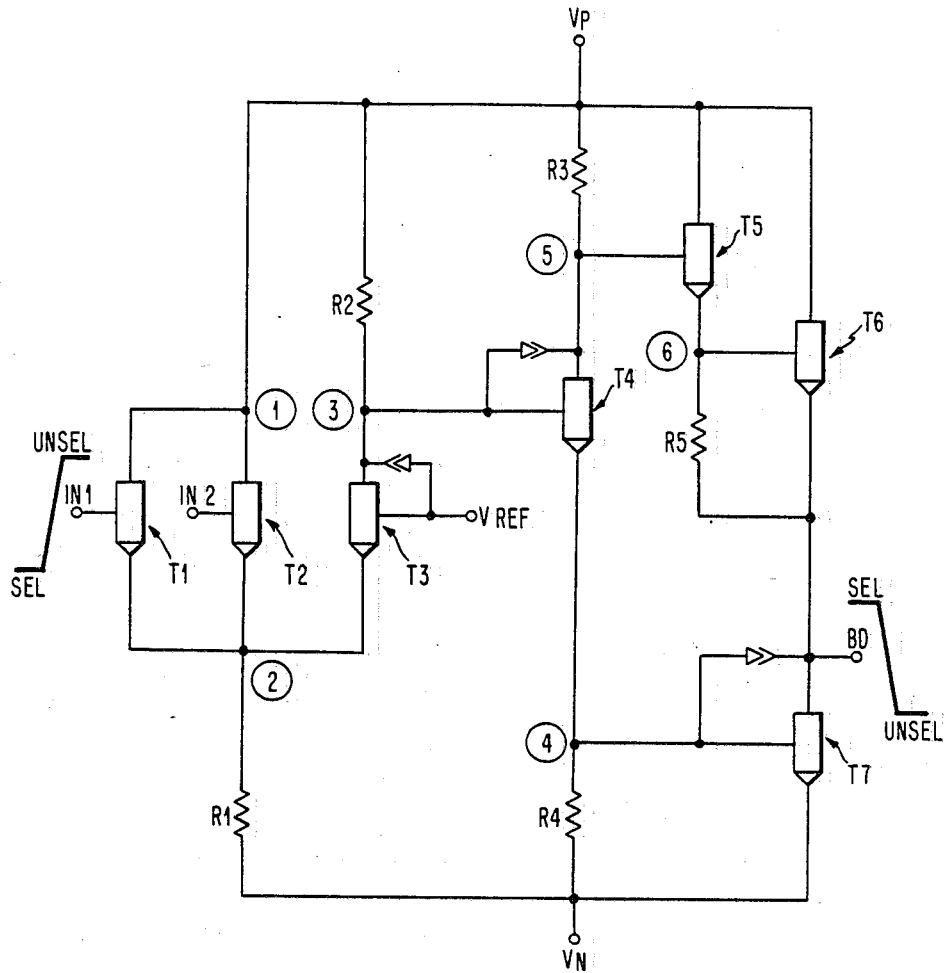
FIG. 5 is a circuit diagram of a bit decoder circuit which may be employed in a RAM (FIG. 3) in accordance with the invention.

The second level decode function is performed by the 16 bit decoders (FIG. 5), which have current switch inputs and high speed push-pull outputs. Input 1 of the bit decoder is connected to one of the 4 lines in BA0—BA3 address group, and input 2 is connected to one in the BA4-BA7 group. Of the 16 BD output lines, only one is decoded to a selected up level. Each BD line fans out to drive four bit columns (one from each data group), so that four cells are selected at a time for READ or WRITE operation.

Figure 6:
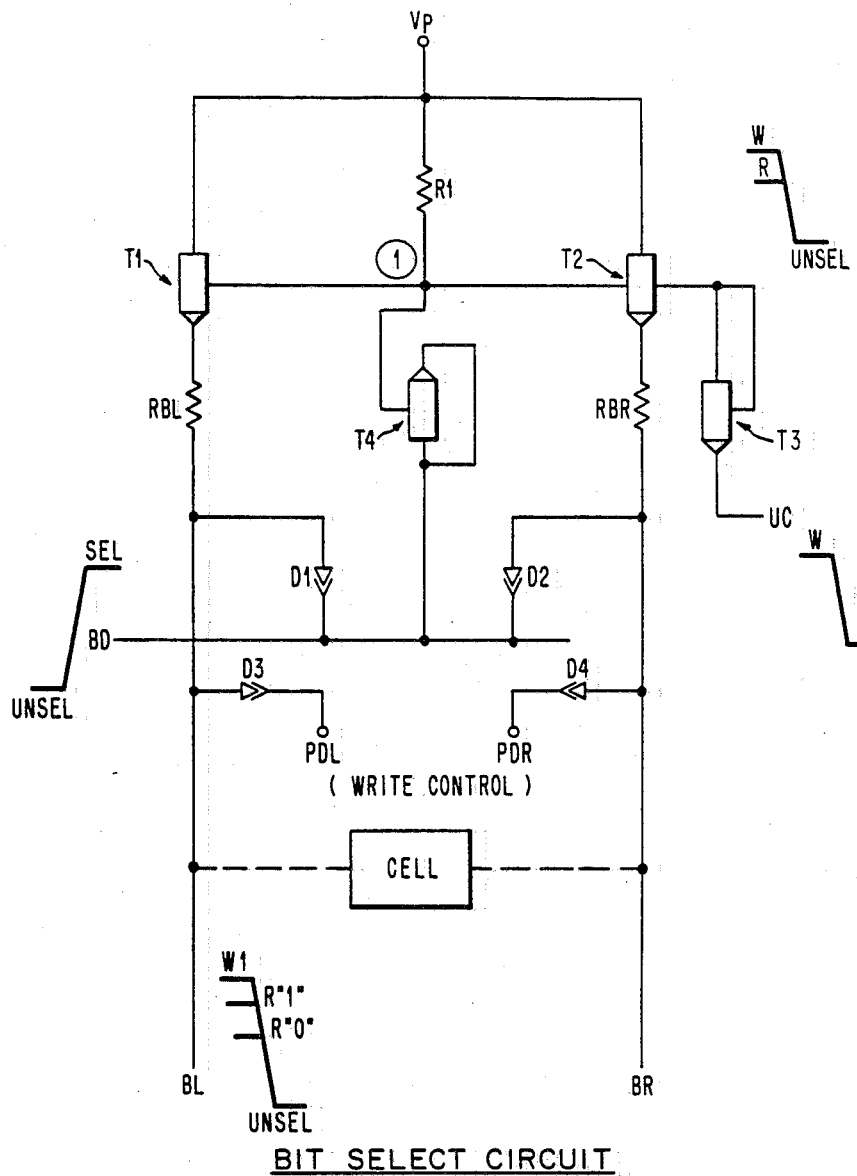
FIG. 6 is a circuit diagram of a bit select circuit which may be employed in a RAM (FIG. 3) in accordance with the invention.
Figure 7:
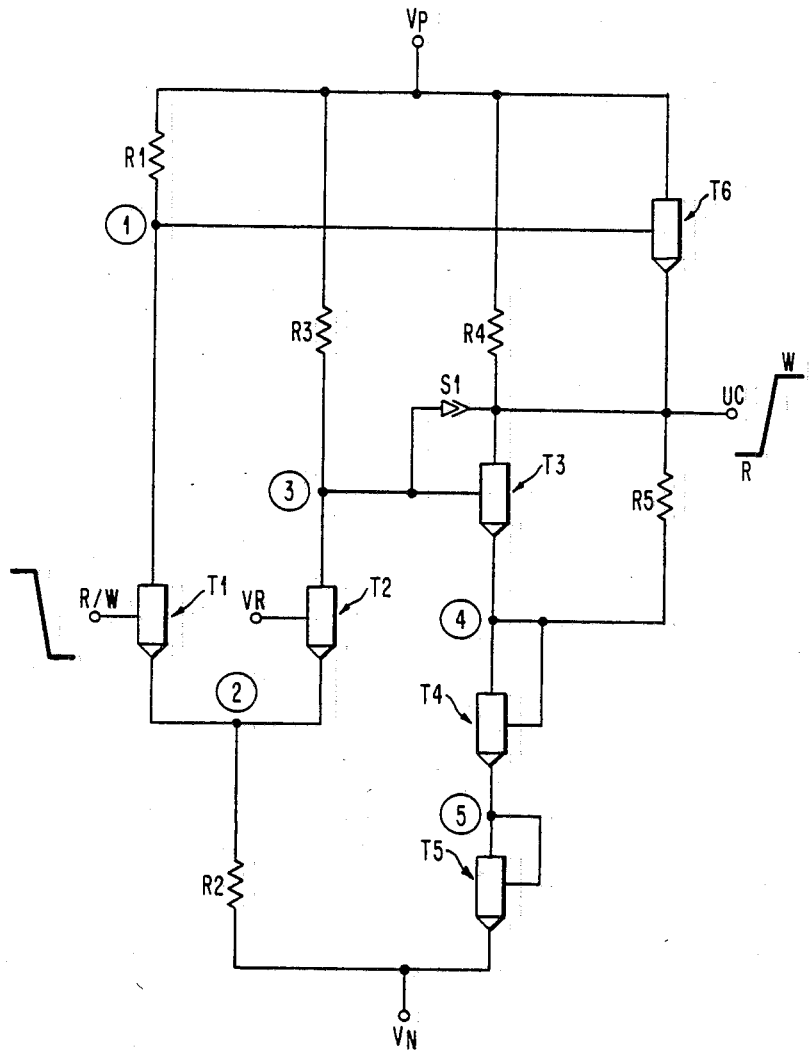
FIG. 7 is a circuit diagram of the bit up-level clamp (Bit UPCL) which may be employed in a RAM (FIG. 3) in accordance with the invention.

Each bit column has a bit select circuit (FIGS. 3 and 6) to perform bit line select and deselect functions. The selected bit lines up level is set by a bit up level clamp circuit (Bit UPCL, FIG. 7), so that the cells' read and write operating points can be readily adjusted by changing the up clamp (UC) level. The bit select circuit's modes of operation are described below.

Unselected state:

In an unselected state, the BD line is held low by its corresponding bit decoder to a voltage close to $V_N$. Node 1 of the bit select circuit is clamped down by the base-collector diode T4. Bit lines BL and BR are also pulled negative to unselected levels by Shottky diodes D1 and D2. With node 1 being down, transistor T1 and T2 are shut off, and no current will flow into the bit rail resistors RBL and RBR. In this state, resistor R1 provides a small DC current that conducts through T4 into the BD line. Since T4 conducts in saturation mode, it develops large diffusion capacitance (due to storage charge) across its B-C junction. The storage charge will be used to boot strap node 1 up rapidly when the BD line is selected high.

Selected READ:

When a bit column is selected, its BD line is actively pulled up by the corresponding bit decoder to a voltage about a $V_{BE}$ below $V_p$. This forces diode T4 to move up quickly at the same rate as the BD line. The rapid discharge of T4's large B-c saturation capacitance provides very fast push up action on node 1, hence turning ON T1 and T2 hard to drive the bit lines up through resistors RBL and RBR.

Figure 12:
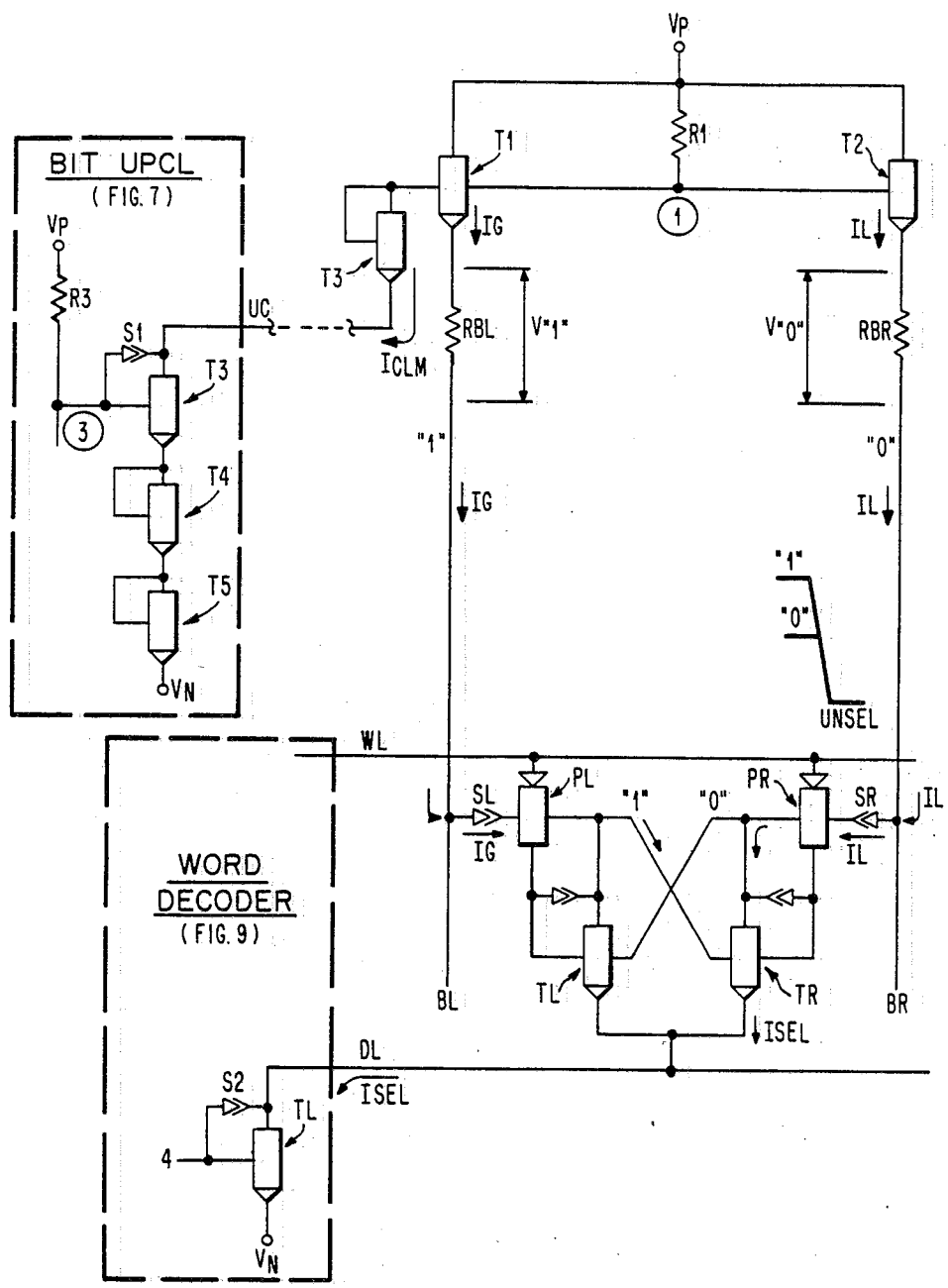
FIG. 12 is a further diagram referred to hereinafter in the explanation of the voltage mode READ operation of the RAM (FIGS. 3 and 8) in accordance with the invention.

During a READ operation, both PDL and PDR lines are high (at around $V_p$), schottky diodes D3 and D4 are OFF and will be out of the way. Node 1's level is clamped by the transistor diode T3 to a voltage set by the UC line (FIG. 12). This READ reference level is generated by the bit up level clamp circuit in such a way that it will track with the selected cells' voltages to ensure proper READ currents (load current $I_L$ and gate current $I_G$). The read currents are supplied by T1 and T2 through resistors RBL and RBR into the cell. Typical READ currents are set at $I_L \approx 1.0$ mA and $I_G \approx 0.2$ mA. This results in a voltage differential of about 500–600 mV across the bit lines for READ sensing by the sense amplifier.

In the selected state, since the BD line's voltage level is higher than node 1, diode T4 as well as Schottky D1 and D2 are OFF. No current will flow into or out of the BD line, hence no voltage drop will exist along this line (as compared with prior designs). Furthermore, the selected cell's read currents are sourced directly from $V_P$ power supply and are distributed evenly across the array independent of BD line's voltage level.

Figure 13:
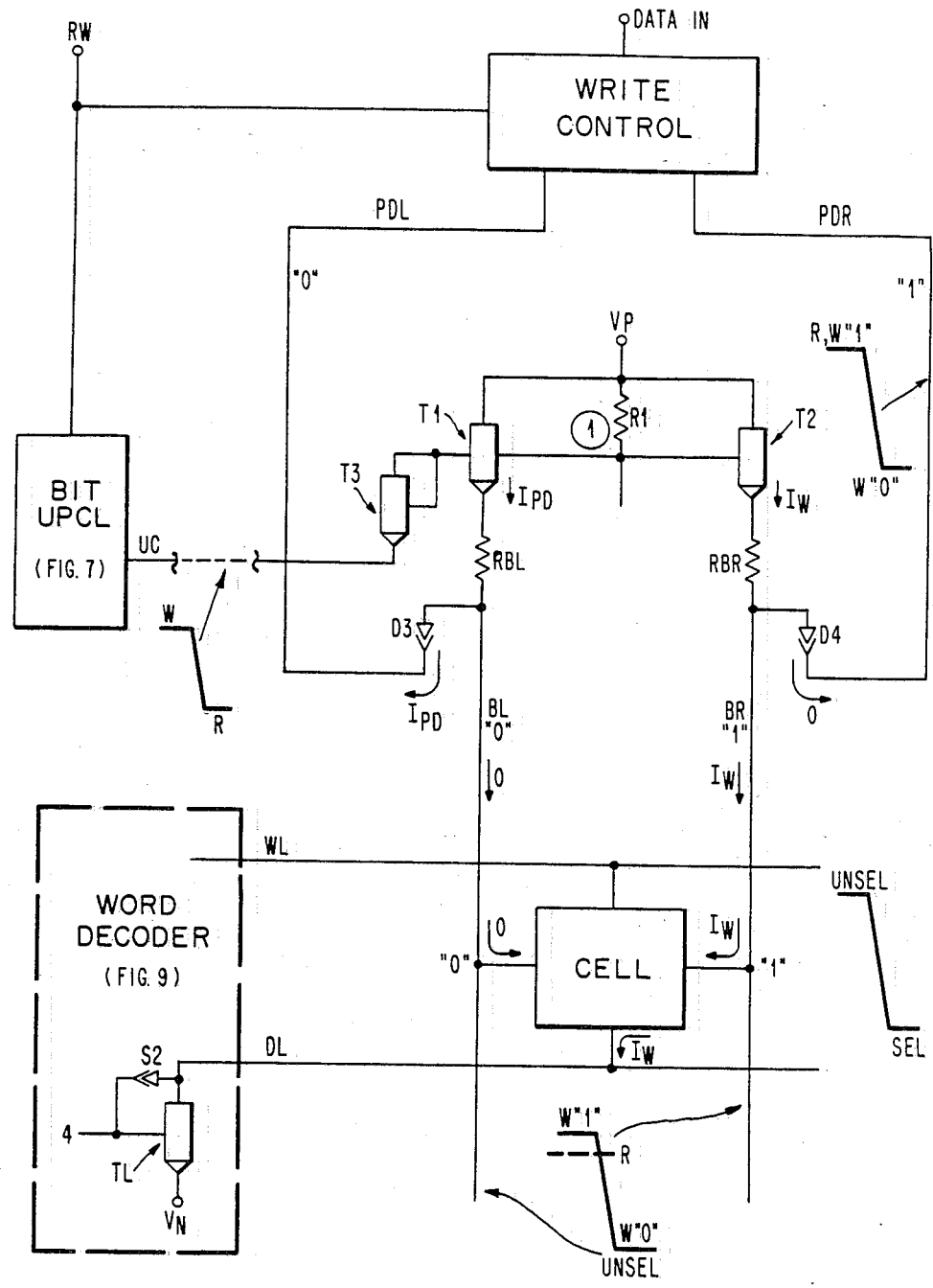
FIG. 13 is a further diagram referred to hereinafter in the explanation of the voltage mode WRITE operation of the RAM in accordance with the invention.

Selected WRITE:

In the WRITE mode, bit lines selection is similar to that of the READ mode as dsecribed above. The only difference here is that one of the WRITE control lines (either PDL or PDR, depending on the data to be written) is driven negative to a voltage close to $V_N$ by the write control circuit prior to bit line selection (FIG. 13). The lowered PDL or PDR line will clamp down BL or BR through schottky diode D3 or D4 respectively, so that when the bit column is selected, only one side of the bit lines will go high to drive write current $I_W$ into the cell. The other side will stay at the down level in order to shut off the bit line current that normally flows into the cell. This mode of write operation is denoted "Differential Mode Write" hereinafter.

During WRITE mode, node 1's up level is also clamped by diode T3 to a voltage set by the UC line. The write reference voltage is typically 600–800 mV above the READ reference voltage, so that sufficient write current is always guaranteed to ensure fast write performance. As in READ mode, the write current is also sourced directly from $V_P$ through T1 or T2. The write performance is therefore not affected by the BD line's level variations.

Deselecting:

When a bit column is not selected, its corresponding bit decoder output falls to a low level. Node 1 of the bit select circuit is pulled negative by diode T4 to turn OFF T1 and T2. The bit lines, at the same time, are also pulled down actively by Schottky diodes D1 and D2 and will discharge into the BD line. After the bit lines are fully discharged to unselected down level, D1 and D2 will stop conducting. The bit column is said to be in an unselected state.

Figure 1A:
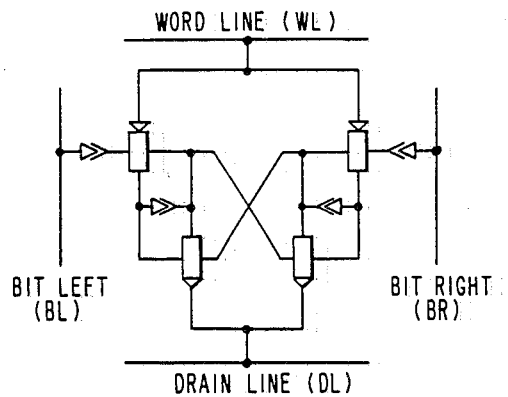
FIG. 1A illustrates the circuit of a known CTS memory cell.

The disclosed bit select scheme has particular utility in arrays using CTS (Complementary Transistor Switch, FIG. 1A) cells. With this scheme, at least the following two advantages have been achieved over the known designs.

(I) Improved bit line "select/deselect" speed, hence faster bit path access time.

(II) Eliminates bit decode up level line drop, hence reduce data retention concerns for the selected cells.

The improved bit selection circuit means, in accordance with the invention includes the following elements:

1. Two level matrix decode (FIG. 3)—First level is emitter dotting of the current switch emitter follower address receivers. Second level is the bit decoders with current switch input and high speed push-pull outputs.

2. Distributive bit select circuit (FIGS. 3 and 6)—It utilizes capacitive discharge mechanism of a saturated base-collector diode (T4) to enhance selection speed and reduce circuit power. It has transistors T1 and T2 to source the READ and WRITE currents directly from power supply $V_p$. It uses Schottky Barrier Diodes (SBD) D1 and D2 for active bit rail pull down during deselect. It also uses Schottky diodes D3 and D4 in conjunction with the write control circuit to enable "Differential Mode Write" for fast write performance.

3. Bit up level clamp (FIGS. 3 and 7)—The selected bit lines' read and write up levels are controlled by a reference circuit (Bit UPCL) so as to enable easy operating point adjustment. This circuit is also designed, as more fully explained hereinafter, to meet various tracking requirements (such as tracking with selected drain line level in read mode).

Figure 9:
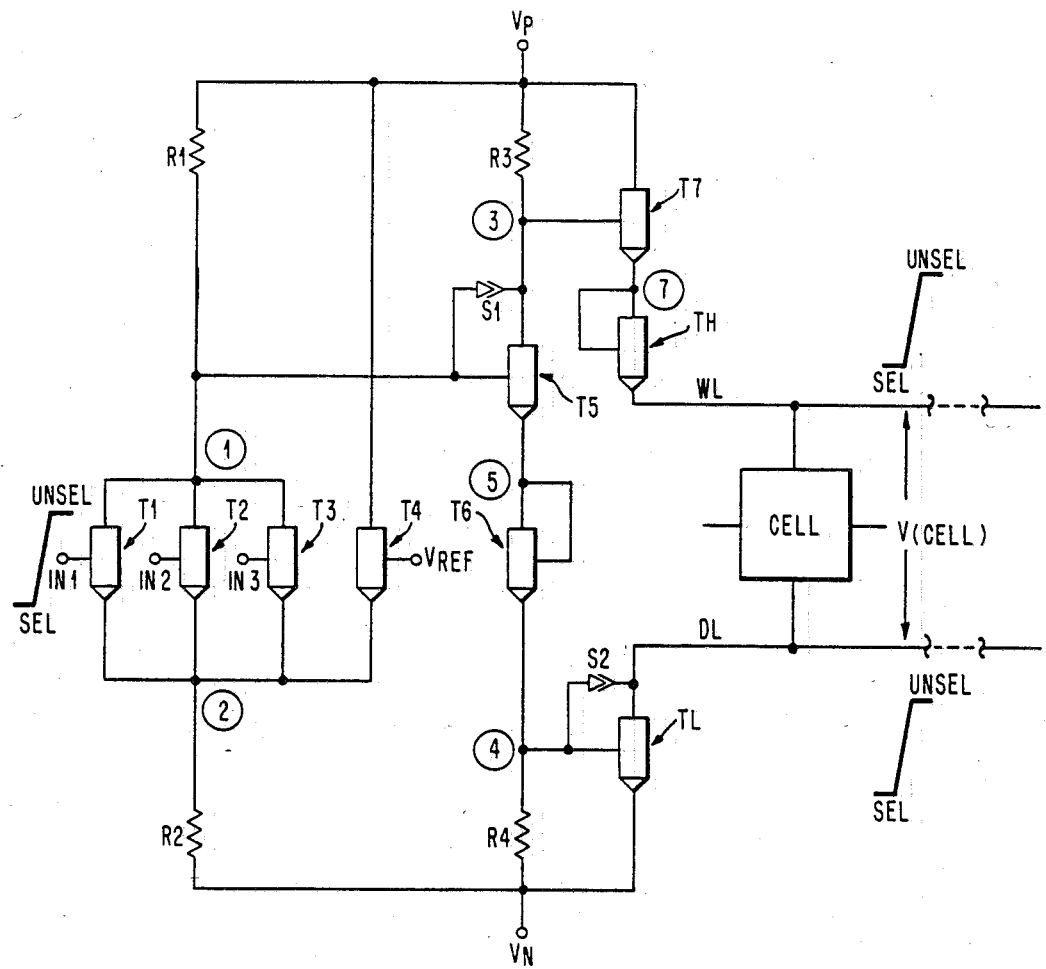
FIG. 9 illustrates the circuit diagram of the word decoder circuit in accordance with FIG. 8 and with the invention.

The improved word line decoder and control circuitry represented by the block labelled "Word Decode" in FIG. 3 is shown in detail in FIGS. 8 and 9. FIG. 8 shows the voltage mode word selection scheme whereas FIG. 9 discloses in detail the circuit of the word decoder.

Referring to FIG. 8, there are 6 word addresses to decode 1 out of 64 rows. A two level matrix decode scheme similar to that of the bit path is employed for word address decoding. The first level decode includes three groups of 4 address lines (WA0-WA3, WA4-WA7, and WA8-WA11) formed from output emitter dotting of the 6 word address receivers. The word address receivers are current switch emitter follower circuits (FIG. 4). They convert the address inputs to true and complement signals. By means of emitter follower output dotting of the address receiver pairs, a partial decode of 1 out of 4 is obtiained from each group, hence giving a total of three selected (low level) lines.

The second level decode function is performed by the 64 word decoders (FIG. 9). Each word decoder has three current switch inputs (IN1-IN3) and two high speed high power push-pull outputs (WL and DL). IN1 of the word decoder is connected to one of the four lines in WA0-WA3 address group. IN2 is connected to one in the second group (WA4-WA7), and IN3 is connected to one in the third group (WA8-WA11). All these three inputs have to be low in order to select a row line. The two outputs of the word decoder are connected to the word line (WL) and drain line (DL) of the memory cells as shown.

Operations of the word decoder, in accordance with the invention, are explained hereinafter.

Unselected state:

An unselected word decoder will have at least one of its three inputs high. Decoding transistors T1, T2 or T3 are turned ON to pull down node 1. Transistors T5 and T6 form a dual phase level shifter, so that node 4 is also pulled negative to a voltage close to $V_N$ and node 3 is pulled positive to $V_P$. With node 4 being down, the open collector transistor TL is shut off, allowing the word line WL and drain line DL to move up to their unselected (high) levels. In this state, the cells' stand-by current, as well as word and drain line voltages are defined by the current sources $I_{SBH}$ and $I_{SBL}$.

To enable fast switching speed, transistors T5 and T6 are never shut OFF but kept in slight conduction. The active pull up devices ($T_7$ and $T_H$) are OFF when the word line reaches its full unselected DC level (about one and a half $V_{BE}$ below $V_P$).

Selected state:

When a word decoder is selected, all its three inputs are low. Transistors T1, T2 and T3 are OFF. Node 1 goes high to turn ON T5 and T6 hard. Node 3 is pulled down by T5's collector to keep $T_7$–$T_H$ OFF, so that WL and DL are allowed to move down to their selected levels. At the same time, node 4 is driven high to turn ON TL. It is this high power open collector pull down action on the drain line that enables the cells to be selected fast. While the drain line is being driven low, the word line follows it at the same rate with a voltage offset defined by the cells.

When the word and drain lines are fully selected, $T_7$–$T_H$ are OFF and TL is maintained ON to sink the large READ/WRITE currents conducting from the selected cells. In this state, the word and drain line voltages are defined by following two equations:

$$V_{(DL)} = V_N + V_{CE(TL)} \quad (1)$$

$$V_{(WL)} = V_{(DL)} + V_{(CELL)} \quad (2)$$

Since the selected drain line is pulled down by a high power open collector transistor ($T_L$), word selection is therefore very fast and its drive capability is not limited by fixed current sources as in prior designs. Furthermore, the selected drain and word line levels are solidly defined to voltages offset from power supply $V_N$, they are more stable than those of the prior art. This technique of word selection is denoted herein as "Voltage Mode Word Selection".

Deselected state:

After a row line has been selected for a READ or a WRITE operation, it is deselected back to its stand-by state. A deselecting word decoder will have at least one of its inputs go positive. Decoding transistors T1, T2 or T3 are turned ON again, driving node 1 down to shut OFF the open collector transistor $T_L$. At the same time, node 4 is pulled positive to $V_P$, driving the emitter follower devices $T_7$–$T_H$ transiently ON to pull up word line WL until it reaches its unselected DC level. While the word line is being pulled positive, drain line DL follows it up at the same rate with a voltage offset defined by the cells. When the word and drain lines are fully up at their stand-by levels, $T_7$–$T_H$ and $T_L$ are all OFF. The row line is now said to be in an unselected state.

READ operation:

A cell is selected for the READ operation when its row lines (WL, DL) and bit lines (BL, BR) are both selected (FIG. 12). The row lines are selected by the voltage mode word selection scheme as previously described. The bit lines are selected by the bit selection scheme explained earlier (FIG. 3). After a cell is fully selected, read currents $I_L$ and $I_G$ are fed into its bit rail Shottky SL and SR, which then couple the cell's internal voltages ("0" and "1") on to the bit lines for READ sensing. In order to guarantee cell stability during READ, $I_L$ and $I_G$ currents have to be controlled within a chosen operating range. This is accomplished by a READ reference level applied to the bit rail driving transistors (T1 and T2 of FIG. 12) from the UC line. The READ reference is generated by a bit up level clamp circuit (Bit UPCL, FIG. 7) which tracks fully with the selected cells, so that sufficient voltage potentials (V"0" and V"1") are always ensured across bit rail resistors RBL and RBR to define $I_L$ and $I_G$ currents. Generation of this READ reference level, and the operation of the bit up level clamp circuit, will be more fully explained in the following sections.

Figure 14:
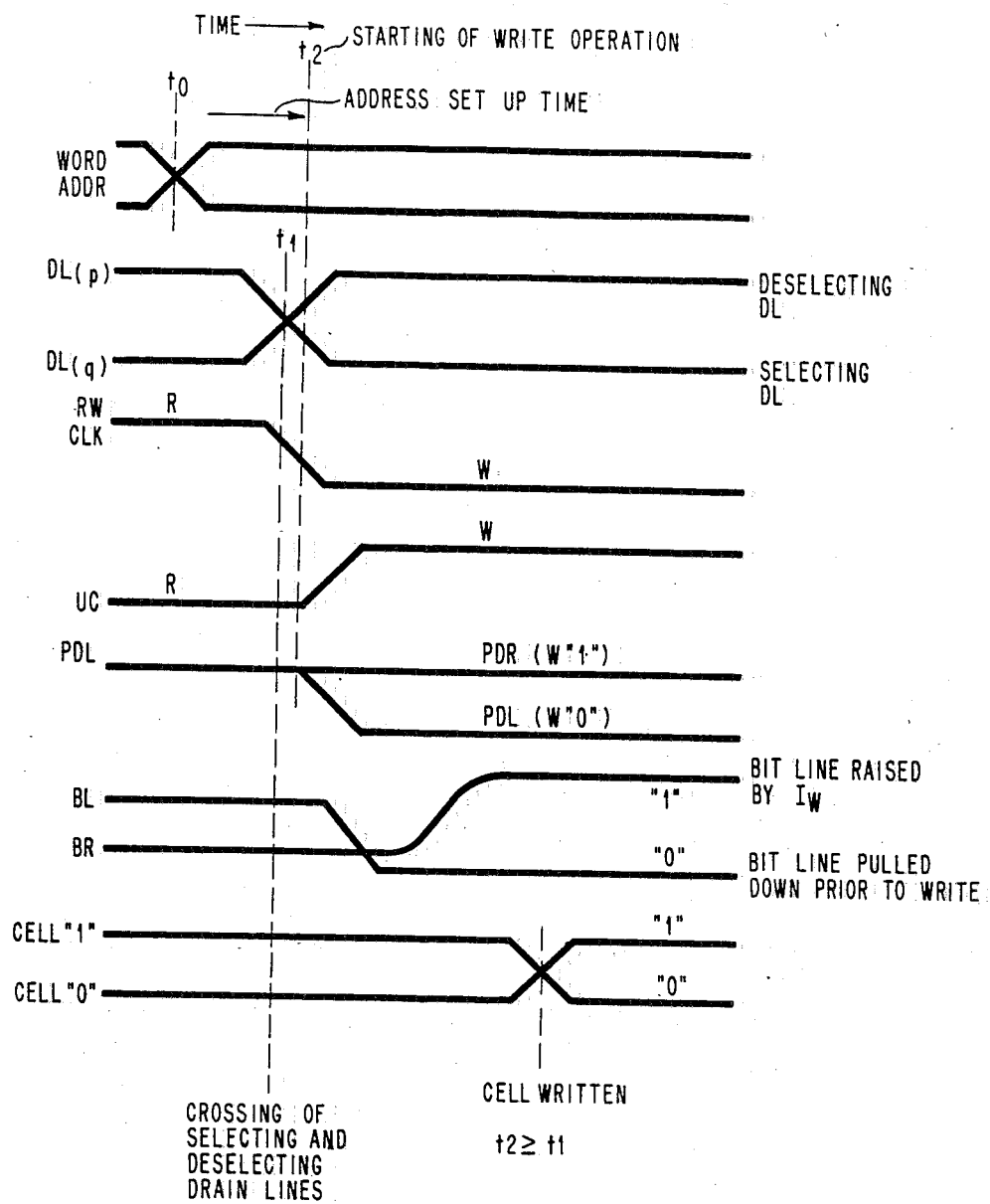
FIG. 14 discloses idealized wave forms of the "WRITE" operation timing.

WRITE Operation:

With voltage mode word selection technique, WRITE operation is performed in three sequential steps (FIGS. 13 and 14).

1. The row lines are selected/deselected as previously described.

2. After crossing of the selecting and deselecting drain lines (See FIG. 14), WRITE operation is initiated. The RW clock switches the bit up level clamp circuit to generate a WRITE reference voltage on the UC line. This RW signal is also applied to a write control circuit, which depending on its data input, will drive either one of its two output lines PDL or PDR low. The lowered PDL or PDR line will then pull down bit line BL or BR respectively by Schottky diodes D3 or D4, so that bit current into this side of the cell is shut off prior to WRITING. The shutting off of the gate current that normally flows into the cell before WRITING is essential for a successful write operation. With the presence of gate current during WRITE, the presently ON NPN transistor in the cell will remain ON and will not be able to be overcome by the write current $I_W$.

3. After gate current is shut OFF, the side of the bit line to be written a "1" is raised high by the bit rail transistor (T1 or T2 of FIG. 13). Write current $I_W$ is then injected into the cell through bit rail resistor RBL or RBR until the desired cell state is reached.

As in READ operation, the magnitude of write current $I_W$ is also controlled by a WRITE reference level applied to the bit rail driving transistors T1 and T2 through the UC line. This write current can readily be adjusted by changing the bit up level clamp WRITE reference level.

The above write scheme is denoted "Differential Mode Write", since one side of the bit line is raised high while the other side is being held low during write time.

The key advantage of this write scheme is that since the drain line is selected to a fixed voltage a $V_{CE}$ above $V_N$, when write current is injected into the cell, the level of this line will not move up but remain stable. The chasing effect with the deselecting cells as exists in "current mode" word selection scheme used by prior art designs is hence eliminated. The RW clock can now come in sooner (as soon as the selecting and deselecting drain lines cross over) without waiting for the deselecting cells to get out of the way. This minimizes address set up time required prior to write. Due to faster word selection and shorter address set up time, write performance is therefore greatly improved. Furthermore, since the selected drain line is solidly held to a voltage level, and the deselected one is actively pulled up quickly to its unselected level, no "write through" (i.e., writing into the deselecting as well as the standby cells) problems exist.

As is submitted to be evident from the above description the use of the voltage mode word selection technique, in accordance with invention, particularly in CTS RAMs, provides the following benefit and advantages:

(1) Enables very high speed word select and deselect, hence faster "READ" performance.
(2) Provides large row lines drive capability, hence very desirable for high density applications.
(3) Stabilizes the selected drain line level, hence eliminates possible data retention and WRITE through problems.
(4) Enables faster "WRITE" performance.

Bit up level clamp circuit:

The proper operation of a voltage mode word selection scheme in a CTS RAM requires a bit up level clamp circuit to define the selected cells' operating levels. This is particularly important for the READ operation. A read reference voltage is generated by the bit up level clamp to track with the selected cells in temperature, power supply ($V_N$) and device ($V_{BE}$ and $V_{FSBD}$) variations, so that proper read currents ($I_G$ and $I_L$) are always guaranteed under all conditions to ensure cell stability. The bit up level clamp circuit (FIG. 7) represented in FIGS. 3 and 3A by the block labelled "BIT UPCL" will now be explained with particular reference to FIGS. 8, 12 and 13.

(1) READ REFERENCE:

Referring to FIG. 12, the voltage level required at the emitter of the clamping diode T3 in READ mode can be determined by summing up the potential rises/falls from $V_N$ in the word decoder.

Voltage
@$T_3 = V_N + V_{BE}(TL) - V_F(S2) + V_{BE}(TR) + V_F(SL) + V"1" + V_{BE}(T1) - V_{BE}(T3)$ Cancelling the $V_{BE}$ rises/falls and $V_F$ rises/falls in the above expression, a simplified equation defining the READ reference voltage is obtained:

Voltage @$T_3 = V_N + 2 V_{BE} + V"1"$  (1)

For a READ operation, the R/W control input of the bit up level clamp circuit (FIG. 7) is high. Transistor T1 is ON and T2 is OFF, so that node 3 is up to trun ON T3, T4 and T5. The output line UC is clamped down by T3 to generate a READ reference voltage defined by the equation below.

$$V_{UC}(READ) = V_N + V_{BE}(T5) + V_{BE}(T4) + V_{BE}(T3) - V_F(S1) \quad (2)$$
$$= V_N + 3 V_{BE} - V_F$$

Equating expressions (1) and (2), we have:

Voltage @ $T_3 = V_{UC}(READ)$  (3)
$\Rightarrow V_N + 2 V_{BE} + V"1" = V_N + 3 V_{BE} - V_F$
$\Rightarrow V"1" = V_{BE} - V_F$ $V"1"$ is the voltage across the "1" side of the bit rail resistor. It is this voltage potential across RBL that defines the gate current $I_G$ to maintain cell stability during READ. The read currents $I_G$ and $I_L$ are related by the following expressions:

$$I_G = \frac{V"1"}{RBL} ; I_L = \frac{V"0"}{RBL}$$

and $V"0" = V"1" V_F$.

As seen from equation (3), since $V"1"$ is defined by the voltage difference between a $V_{BE}$ (forward mode Base-Emitter voltage of an NPN transistor) and $V_F$ (forward conduction voltage of a Schottky diode), it is therefore independent of power supply ($V_P$ and $V_N$) variations. Furthermore, temperature effects on the devices are also equally cancelled out.

(2) WRITE REFERENCE:

In a WRITE mode, the R/W input is low. Transistor T1 is OFF and T2 is ON. Node 1 is high to pull up T6 while node 3 is down to shut OFF T3. The WRITE reference level at the UC line is given by:

$$V_{UC}(WRITE) = V_P - V_{BE}(T6) \quad (4)$$

This WRITE reference voltage is applied to the bit rail driving transistors (T1 and T2, FIG. 13) to define the write current $I_W$.

Read Sensing Circuitry:

The operation of circuitry represented in FIG. 3 by the block labelled "sensing circuitry" will now be explained with particular reference to FIGS. 10 and 11.

Figure 3A:
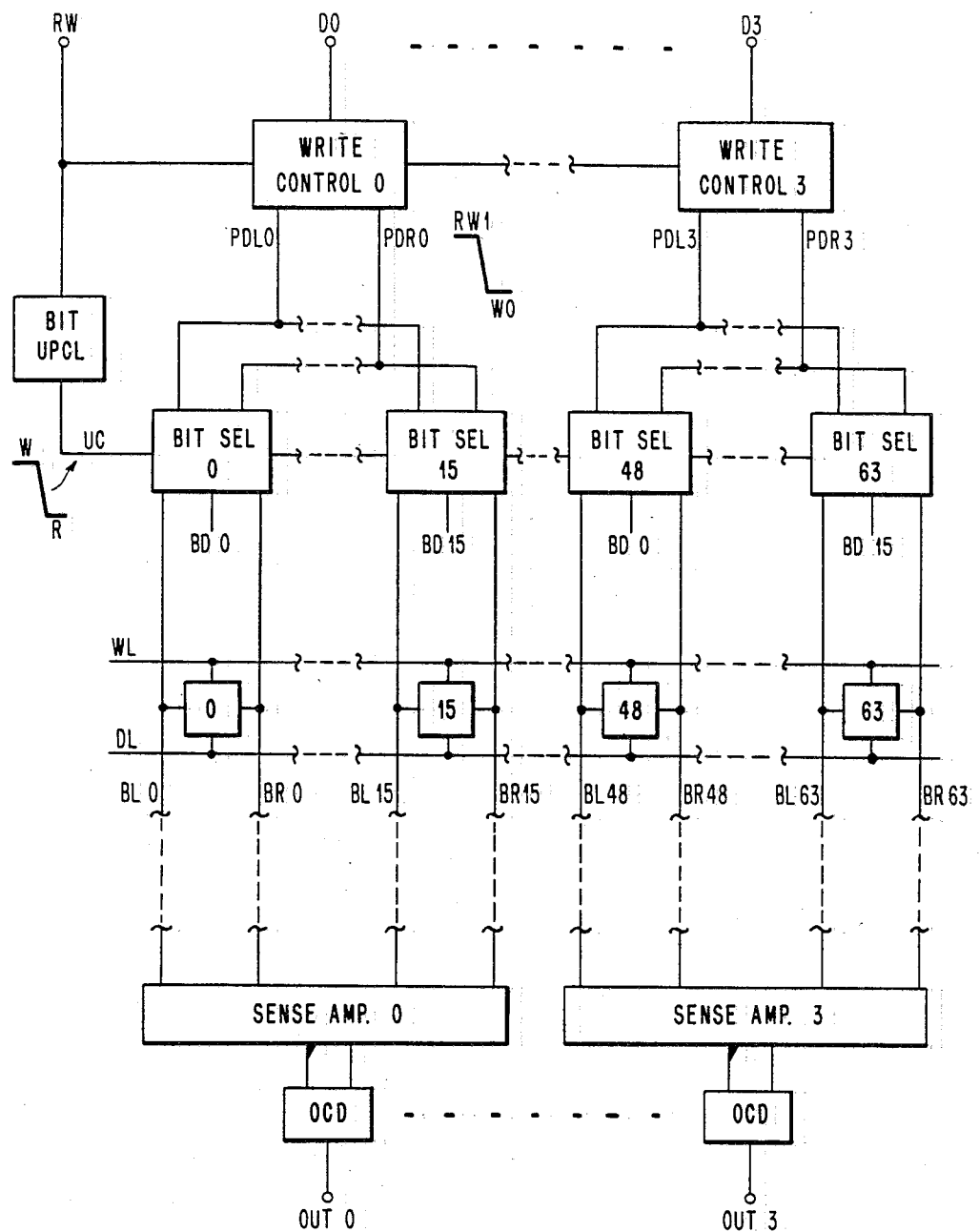
FIG. 3A (to be reviewed in conjunction with FIG. 3) illustrates the sensing and write control circuitry of the random access memory in accordance with FIG. 3 and with the invention.

FIG. 3A illustrates the sensing scheme employed for the RAM shown in FIG. 2. The 64 bit columns of this RAM is divided into four data groups of 16 bits. Each data group contains a sense amplifier (FIG. 10) for READ sensing. The state of the sense amplifier is determined by the selected cell within its data group. Data read by the sense amplifier is sent off chip through an off chip driver (OCD) circuit.

Figure 11:
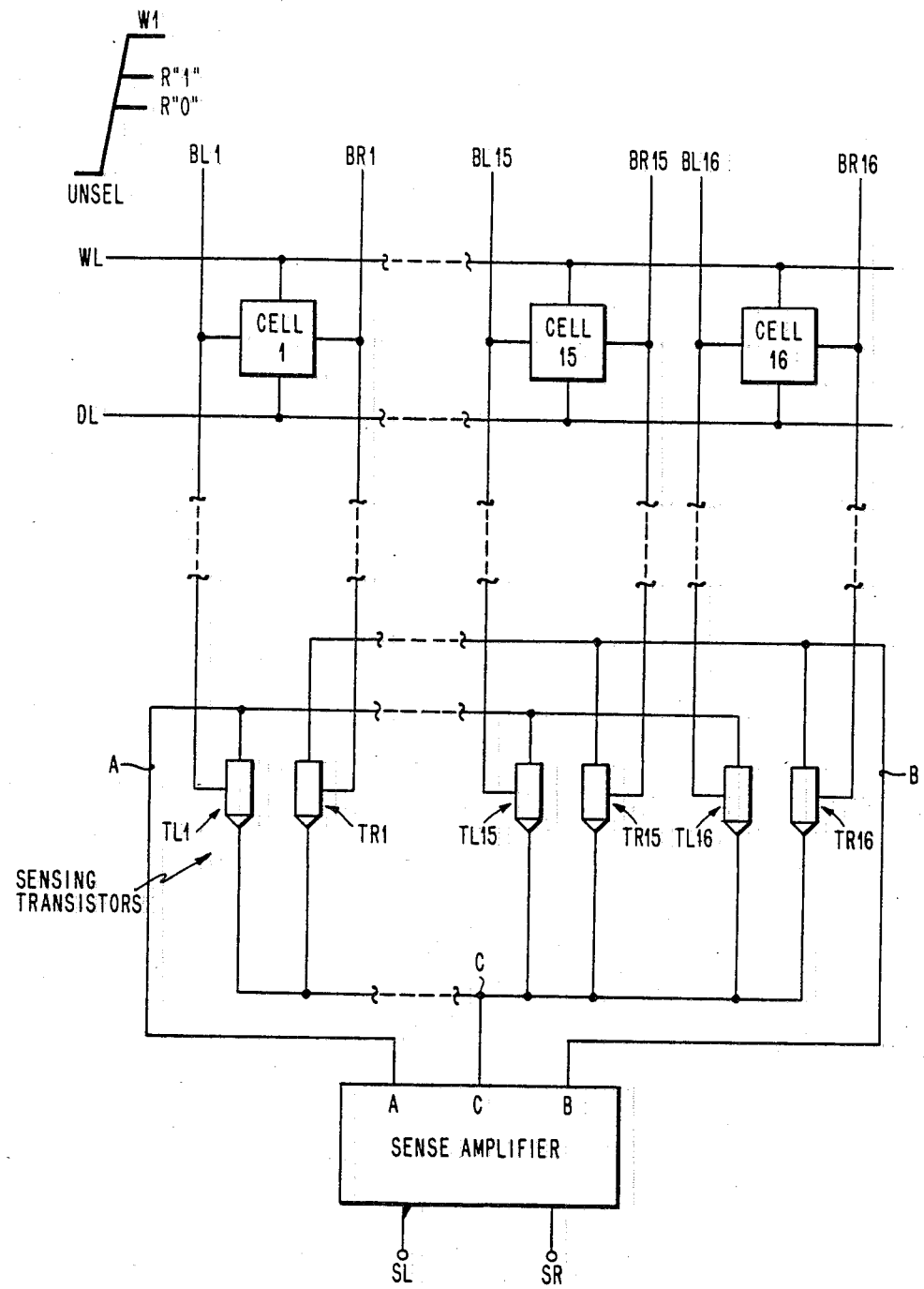
FIG. 11 is a rearrangement of, and further illustrates the senses amplifier circuitry of FIG. 10.

FIG. 11 illustrates the sense amplifier arrangement for a data group. Within a data group, each bit column has a pair of sensing transistors (TL and TR) attached to its bit lines for voltage sensing. When a cell is selected for READ, its row lines (WL and DL) are pulled down by its corresponding word decoder, and its bit lines (BL and BR) are raised up by its bit select circuit. Since there are 16 bit columns per data group, bit selection is always 1 out of 16. Of the thirty-two bit lines, only two are up at any one time. The higher of these two selected bit lines turns on the corresponding sensing transistor in the sense amplifier circuit.

Figure 10:
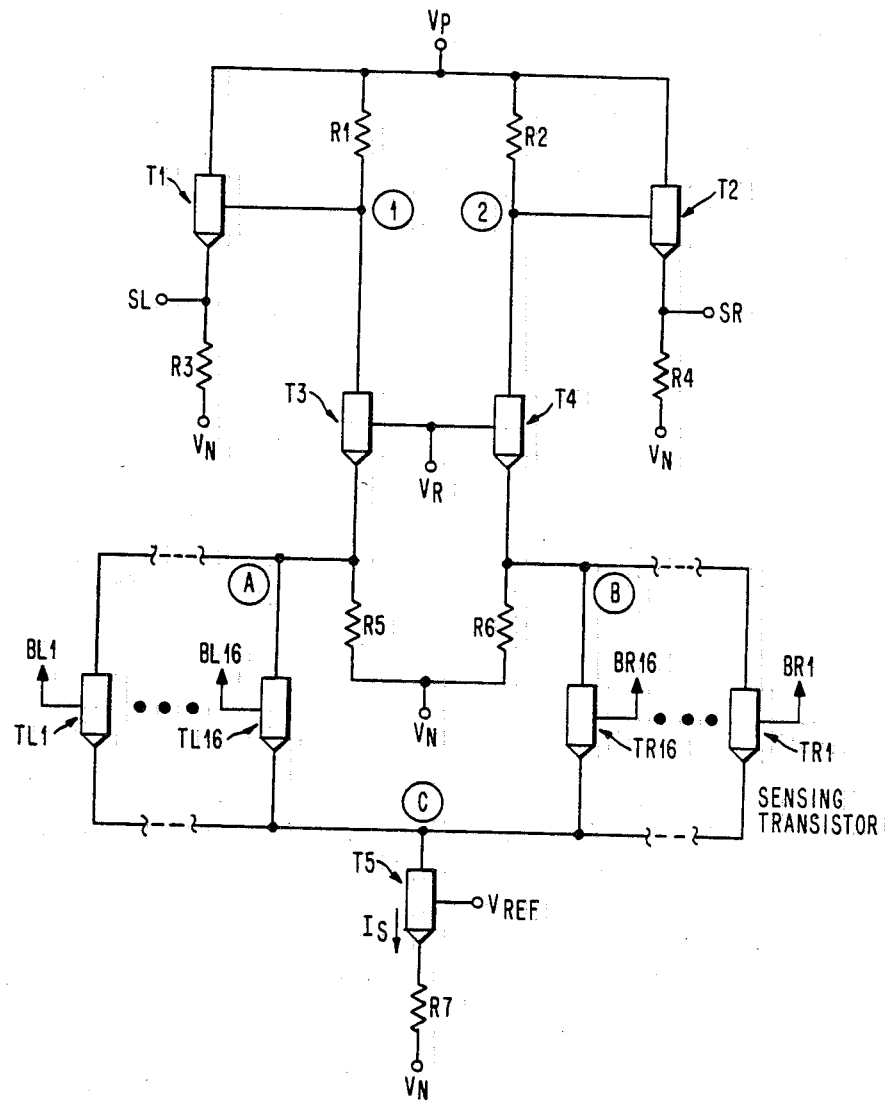
FIG. 10 illustrates the circuitry of a sense amplifier which may be employed in a RAM (FIG. 3) in accordance with the invention.

Sense Amplifier Circuit Operation:

FIG. 10 illustrates a high speed sense amplifier circuit designed for the above sensing scheme. The circuit uses current steering technique to enable very fast switching performance. Its sensing speed is independent of the number of bit columns in the data group.

Referring to FIG. 10, the thrity-two sensing transistors T11 to TL16 and TR1 to TR16 form a big current switch input for the sense amplifier. The bases of these transistors are connected to the sixteen bit columns in the data group. Transistors T1 and T2 are emitter followers providing dual-phase outputs to drive the off chip driver. Transistors T3 and T4 are set to be ON all the time to define a fixed voltage at nodes A and B, so that switching of these two devices is done in current mode.

At any time, either bit-left or bit-right of a selected bit column is up at a high voltage level. The higher voltage bit line turns on its corresponding sensing transistor. The sense current $I_S$ from the current source T5 is then steered by the ON sensing transistor through either T3 or T4, pulling node 1 or 2 down accordingly.

Since voltage levels at node A and B will never be switched but remain fixed, any capacitance at these nodes, therefore will have no effect on the switching time. In fact, the circuit's delay will stay constant, disregarding the number of sensing transistors attached to its input stage. Furthermore, transistors T1, T2 and T3, T4 are active all the time; hence, their switching delay is kept to a minimum.

The features of the sense amplifier circuit in FIG. 10 are summarized as follows:
1. The sensing transistors are configured as a bit current switch, with their bases connected to bit lines within the data group. This forms the input stage of the sense amplifier.
2. The switching of the circuit is done in current mode, i.e., input voltages at A and B are fixed, and switching is performed by steering sense current $I_S$ through T3 or T4. This mode of operation enables very large fan-in capability, as well as high circuit speed independent of input loadings.
3. All switching devices (T1, T2 and T3, T4) are kept active at all times to minimize circuit delay.

It is to be appreciated, that for convenience of explanation and understanding, in the foregoing description of applicants' invention only a limited number of memory cells, word lines etc. were shown and described. Persons skilled in the art readily recognize that the size of the Array depicted in the drawing and described in the specification is not to be construed as a limitation on applicants' invention.

While this invention has been particularly described with reference to the preferred embodiments thereof, it will be understood by those skilled in the art that the foregoing and other changes in from and details may be made therein without departing from the spirit and scope of the invention.

What is claimed is:

1. In a random access memory, said random access memory having enhanced bit line selection speed and enhanced deselection speed, said memory including:
   a plurality of memory cells arranged in n rows and m columns, where n and m are respectively positive integers;
   n pairs of word lines, each pair of said n pairs of word lines being connected to the memory cells in a discrete one of said n rows of memory cells;
   m pairs of bit lines, each pair of bit lines having a first bit line and a second bit line, each pair of said m pairs of bit lines being connected to the memory cells in a discrete one of said m columns of memory cells;
   m bit select circuits, each of said m bit select circuits being connected to a discrete one of said m pairs of bit lines;
   multi-level address decode circuit means, said multi-level address decode circuit means having output circuit means including a plurality of select lines, each of said select lines being connected to at least a predetermined one of said m bit select circuits;
   a bit up-level clamp circuit having an output line; and,
   each of said bit select circuits comprising:
      first and second transistors, said first and second transistors each having an emitter, base and collector, said collectors of said first and second transistors being connected in common to a potential source,
      a first resistor connected between said potential source and a common connection of said bases of said first and second transistors,
      a second resistor connected between said emitter of said first transistor and said first bit line of said pair of bit lines connected to said bit selection circuit,
      a third resistor connected between said emitter of said second transistor and said second bit line of said pair of bit lines connected to said bit selection circuit,
      a first diode connected between a predetermined one of said plurality of select lines and the first bit line of said bit line pair connected to said bit select circuit,
      a second diode connected between said predetermined one of said plurality of select lines and the second bit line of said bit line pair connected to said bit select circuit,
      a third diode connected between said predetermined one of said plurality of select lines and the common connection of said bases of said first and second transistors of said bit select circuit,
      a fourth diode connected between said common connection of said bases of said first and second transistors and said output line of said bit up-level clamp circuit,
      a fifth diode connected between said first bit line of said pair of bit lines connected to said bit selection circuit and a write control circuit, and
      a sixth diode connected between said second bit line of said pair of bit lines connected to said bit selection circuit and said write control circuit.

2. In a random access memory, said random access memory having enhanced bit line selection speed and enhanced deselection speed, said memory including:
   a plurality of memory cells arranged in n rows and m columns, where n and m are respectively positive integers;
   n pairs of word lines, each pair of said n pairs of word lines being connected to the memory cells in a discrete one of said n rows of memory cells;
   m pairs of bit lines, each pair of bit lines having a first bit line and a second bit line, each pair of said m pairs of bit lines being connected to the memory cells in a discrete one of said m columns of memory cells;
   m bit select circuits, each of said m bit select circuits being connected to a discrete one of said m pairs of bit lines;

multi-level address decode circuit means, said multi-level address decode circuit means having output circuit means including a plurality of select lines, each of said select lines being connected to at least a predetermined one of said m bit select circuits;
a bit up-level clamp circuit having an output line; and,
each of said bit select circuits comprising:
first and second transistors, said first and second transistors each having an emitter, base and collector, said collectors of said first and second transistors being connected in common to a potential source,
a first resistor connected between said potential source and a common connection of said bases of said first and second transistors,
a second resistor connected between said emitter of said first transistor and said first bit line of said pair of bit lines connected to said bit selection circuit,
a third resistor connected between said emitter of said second transistor and said second bit line of said pair of bit lines connected to said bit selection circuit,
a first diode connected between a predetermined one of said plurality of select lines and the first bit line of said bit line pair connected to said bit select circuit,
a second diode connected between said predetermined one of said plurality of select lines and the second bit line of said bit line pair connected to said bit select circuit,
a third diode connected between said predetermined one of said plurality of select lines and the common connection of said bases of said first and second transistors of said bit select circuit, and
a fourth diode connected between said common connection of said bases of said first and second transistors and said output line of said bit up-level clamp circuit.

3. In a random access memory having a plurality of columns of memory cells, each column of memory cells including a bit line pair, each column of memory cells having a bit select circuit,
a two level matrix decode scheme utilized in conjunction with said bit select circuits to avoid voltage drop due to fan-out current,
each bit select circuit including circuit means for increasing the "select speed" of the bit column selected,
clamping means associated with each bit line pair, said clamping means limiting the up-level potential of the selected bit line pair, and
each bit select circuit further including circuitry for enhancing the discharge rate of the selected bit line pair upon deselection thereof.

4. Improved bit select circuitry for a memory array having CTS (Complementary transistor Switch) memory cells, said memory array including, a plurality of memory columns, each memory column having a plurality of CTS memory cells connected between a pair of bit lines, said bit select circuitry including interconnected first and second level matrix decoders, said first level decoder being adapted to receive a column address, said bit lines of each memory column being connected a discrete bit select circuit, each of said bit select circuits being connected to an output of said second level decoder, a bit up-level clamp circuit connected to each of said bit select circuits, each of said bit select circuits including first circuit means for increasing the speed of selection of a selected pair of bit lines, said bit up-level clamp circuit cooperating with said bit select circuit of said selected pair of bit lines for positively limiting the upper potential level of said selected pair of bit lines, and each of said bit select circuits including second circuit means for increasing the speed of deselection of the selected pair of bit lines.

5. In a monolithic random access memory for storing binary data, said memory comprises:
an array of memory cells having m columns and n rows, where m and n are positive integers, and said memory array including $m \times n$ memory cells, where each of said cells has the capacity to store one binary bit and each of said n rows of memory cells has the capacity to store m binary bits;
m pairs of bit lines, each pair of said m pairs of bit lines including a first bit lines BL and a second bit line BR;
n pairs of word lines, each pair of said n pairs of word lines including an upper (word) word line and a lower (drain) word line;
each of said memory cells of said $m \times n$ array of memory cells being connected to the first bit line BL and the second line BR of a predetermined one of said m pairs of bit lines;
each of said memory cells of said $m \times n$ array of memory cells being also connected to the upper word line and the lower (drain) word line of a predetermined one of said n pairs of word lines;
m bit select circuits, each of said m bit select circuits being connected to a discrete one of said m pairs of bit lines;
a switchable bit up level clamp circuit having an output terminal connected to each of said m bit select circuits;
bit address decoder circuit means coupled to said m bit select circuits for selecting at least one of said bit select circuits; and
word line decoder circuit means coupled to said n pairs of word lines for selecting one of said n pairs of word lines, whereby the operation of said bit address decoder circuit means in conjunction with the operation of said word line decoder circuit means selects at least a predetermined one of said $m \times n$ array of memory cells.

6. In a monolithic random access memory for storing binary data, as recited in claim 5, wherein each of said bit select circuits includes first circuit means for increasing the "select speed" of the bit column (bit line pair) selected and wherein each of said bit select circuits further includes second circuit means for enhancing the discharge rate of the bit column (bit line pair) upon deseclection thereof.

7. In a monolithic random access memory for storing binary data, as recited in claim 6, wherein said switchable bit up level clamp includes a read/write control input for receiving a read signal or a write signal, said switchable bit up level clamp limiting the up potential of the bit line pair selected in response to receipt of a write signal calling for a write operation.

8. In a monolithic random access memory for storing binary data, as recited in claim 7, wherein each of said m bit select circuits includes:
first and second transistors each having emitter, base and collector, said collectors of said first and second transistors being connected in common to a first source of potential, and said bases of said first and second transistors being connected in common via a first resistor to said first source of potential;

a second resistor RBL connected between said emitter of said first transistor and said first bit line BL of said pair of bit lines connected to said bit select circuit;

a third resistor RBR connected between said emitter of said second transistor and said second bit line BR of said pair of bit Lines connected to said bit select circuit;

first and second oppositely poled diodes serially connected between said first bit line BL and said second bit line BR of said pair of bit lines connected to said bit select circuit;

capacitive means connected between said juncture of said first and second serially connected diodes and said common connection of said bases of said first and second transistors;

a third diode serially connected between said common connection of said bases of said first and second transistors and said switchable bit up level clamp circuit; and connection means connecting said juncture of said first and second diodes to said bit address decoder circuit means.

9. In a monolithic random access memory for storing binary data, as recited in claim 8, wherein said capacitive means connected between said juncture of said first and second serially connected diodes and said common connection of said bases of said first and second transistors is the base-collector diode of a third transistor having an emitter, base and collector.

10. In a monolithic random access memory for storing binary data, as recited in claim 9, wherein said base of said third transistor is connected to said common connection of said bases of said first and second transistors, and said emitter and collector of said third transistor are connected in common to said juncture of said serially connected first and second diodes.

11. In a monolithic random access memory for storing binary data, as recited in claim 10, wherein said first and second oppositely poled serially connected diodes are respectively Schottky diodes, said third diode is a base-emitter diode of a fourth transistor having an emitter, base and collector, said collector and base of said fourth transistor being connected in common to said common connection of said bases of said first and second transistors, and said emitter of said fourth transistor being connected to said switchable bit up level clamp circuit.

12. In a monolithic random access memory for storing binary data, as recited in claim 11, wherein said switchable bit up level clamp circuit comprises current switch circuit means and said read/write control input is the switchable control thereof.

13. In a monolithic random access memory for storing binary data, as recited in claim 12, wherein said switchable bit up level clamp circuit comprises:

fifth, sixth, seventh and eighth transistors, each of said fifth, sixth, seventh and eighth transistors having an emitter, base and collector, said emitters of said fifth and sixth transistors being connected in common, said read/write control input of said switchable bit up level clamp circuit being connected to said base of said fifth transistor, said base of said sixth transistor being connected to a first reference source of potential, said collector of said sixth transistor being connected to said base of said seventh transistor, and collector of said seventh transistor being connected to said emitter of said eighth transistor, said collector of said eighth transistor being connected to said first source of potential, and said base of said eighth transistor being connected to said collector of said fifth transistor;

a fourth resistor, said fourth resistor connecting said collector of said fifth transistor to said first potential source;

a fifth resistor, said fifth resistor connecting said common connection of said emitters of said fifth and sixth transistors to a second source of potential;

a sixth resistor, said sixth resistor connecting said collector of said sixth transistor to said first source of reference potential;

a seventh resistor, said seventh resistor connecting said collector of said seventh transistor to said said first source of potential;

an eighth resistor, said eighth resistor connecting said emitter of said eighth transistor to said emitter of said seventh transistor;

fourth and fifth serially connected diodes, said fourth and fifth serially connected diodes being connected between said emitter of said seventh transistor and said second source of potential; and, said switchable bit up level clamp circuit output terminal being connected to said emitter of said eighth transistor and each of said m bit select circuits.

14. In a monolithic random access memory for storing binary data, as recited in claim 13, wherein said fourth and fifth serially connected diodes are respectively provided by "diode connected transistors".

* * * * *